US012807482B2

(12) United States Patent
Loeppert et al.

(10) Patent No.: US 12,807,482 B2
(45) Date of Patent: Nov. 24, 2026

(54) SPRING SUPPORTED AND SEALED MEMS DIAPHRAGM ASSEMBLY

(71) Applicant: Knowles Electronics, LLC, Itasca, IL (US)

(72) Inventors: Peter V. Loeppert, Durand, IL (US); Michael Pedersen, Long Grove, IL (US)

(73) Assignee: Knowles Electronics, LLC, Itasca, IL (US)

( * ) Notice: Subject to any disclaimer, the term of this patent is extended or adjusted under 35 U.S.C. 154(b) by 978 days.

(21) Appl. No.: 17/936,931

(22) Filed: Sep. 30, 2022

(65) Prior Publication Data

US 2024/0109770 A1 Apr. 4, 2024

(51) Int. Cl.
*B81C 1/00* (2006.01)
*B81B 3/00* (2006.01)

(52) U.S. Cl.
CPC ........ *B81C 1/00158* (2013.01); *B81B 3/0021* (2013.01); *B81B 2201/0257* (2013.01); *B81B 2203/0163* (2013.01); *B81B 2203/0307* (2013.01); *B81C 2201/013* (2013.01); *B81C 2201/017* (2013.01)

(58) Field of Classification Search
CPC .......... B81C 1/00158; B81C 2201/013; B81C 2201/017; B81B 3/0021; B81B 2201/0257; B81B 2203/0163; B81B 2203/0307
See application file for complete search history.

(56) References Cited

U.S. PATENT DOCUMENTS

| | | | | |
|---|---|---|---|---|
| 5,146,435 | A | 9/1992 | Bernstein | |
| 5,452,268 | A | 9/1995 | Bernstein | |
| 9,676,615 | B2 | 6/2017 | Miao | |
| 2015/0350792 | A1* | 12/2015 | Grosh | H10N 30/50 257/416 |
| 2016/0304337 | A1 | 10/2016 | Miao | |
| 2020/0112799 | A1* | 4/2020 | Kuntzman | H04R 7/18 |

FOREIGN PATENT DOCUMENTS

| | | | |
|---|---|---|---|
| DE | 112019005007 | T5 | 7/2015 |
| DE | 112017006664 | T5 | 9/2019 |

OTHER PUBLICATIONS

Office Action (Official Communication) for DE 102023117819; mailed Apr. 16, 2026.

* cited by examiner

*Primary Examiner* — Joshua Benitez Rosario
*Assistant Examiner* — Christopher A Culbert
(74) *Attorney, Agent, or Firm* — FLENER IP & BUSINESS LAW; Zareefa B. Flener; Youngae Jun

(57) ABSTRACT

A method of fabricating a die for a microelectromechanical systems (MEMS) microphone includes the steps of forming a diaphragm, etching a plurality of slots through the diaphragm to define a plurality of springs, releasing the diaphragm and the plurality of springs, wherein the plurality of springs relieves intrinsic stress of the diaphragm, and sealing the plurality of slots with sealing material, thereby disabling the springs.

6 Claims, 15 Drawing Sheets

SPRING SUPPORTED AND SEALED MEMS DIAPHRAGM ASSEMBLY

FIELD OF THE DISCLOSURE

The present disclosure relates to a method for making a die for a microelectromechanical systems (MEMS) diaphragm assembly and the die made thereby, and more particularly to a method for making a die for a microelectromechanical systems (MEMS) diaphragm assembly including a spring that relieves inherent stress within the assembly wherein the spring is sealed subsequent to relieving the stress.

BACKGROUND

Stiffness is a hindrance to compliance or sensitivity of any MEMS diaphragm assembly, and is therefore undesirable. A MEMS dual diaphragm assembly having a low pressure region between the diaphragms is relatively stiff due at least in part to the structure of the diaphragm assembly and the influence of outside pressure. However, the largest contributor to the stiffness of any MEMS diaphragm assembly is the intrinsic stress within the constituent materials. Given this stress induced stiffness, a die size that is larger than desirable and thus having a higher cost than desirable may be necessary to reach a target sensitivity. A need therefore exists for a method for producing a low intrinsic stress MEMS diaphragm assembly that doesn't require a larger than desirable die size.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

DETAILED DESCRIPTION

Figure 1:
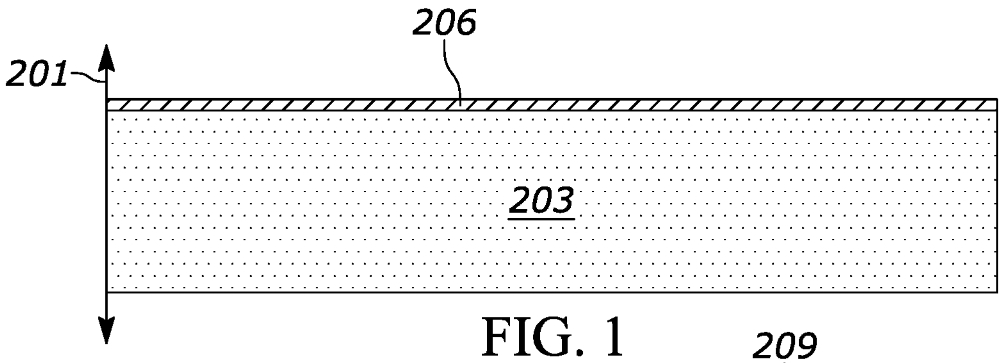
FIG. 1 illustrates a schematic cross-sectional view of an exemplary first embodiment of a die for a MEMS diaphragm assembly at a step in fabrication thereof, the view taken generally along the lines 2-2 of FIG. 3.

According to an embodiment, a method of fabricating a die for a microelectromechanical systems (MEMS) microphone comprises the steps of forming a diaphragm, etching a plurality of slots through the diaphragm to define a plurality of springs, releasing the diaphragm and the plurality of springs, wherein the plurality of springs relieves intrinsic stress of the diaphragm, and sealing the plurality of slots with sealing material, thereby disabling the springs. In an embodiment the forming step comprises forming the diaphragm over a substrate, and the method further comprises before the releasing step the steps of etching away a first portion of the substrate underlying the plurality of springs such that the diaphragm has a first region overlying the first portion and not anchored to the substrate and a second region that is anchored to a second portion of the substrate, wherein the plurality of springs is disposed within the first region proximate to a boundary between the first and second regions. In an embodiment the first region is movable in response to pressure waves during operation of the MEMS microphone. In an embodiment the sealing material comprises a first material and the diaphragm is formed of a second material. According to an embodiment the method further comprises a step after the forming step and before the etching step of forming a rigid element parallel to and spaced apart from the diaphragm wherein the diaphragm comprises a first electrode, and the rigid element comprises a second electrode.

In an embodiment, a method of fabricating a die for a microelectromechanical systems (MEMS) microphone comprises forming an assembly comprising a first diaphragm, a second diaphragm parallel to and spaced apart from the first diaphragm, and a rigid central layer disposed between the first and second diaphragms, etching a first plurality of slots through an outer region of the first diaphragm to define a first plurality of springs, etching a second plurality of slots through an outer region of the second diaphragm to define a second plurality of springs, releasing the assembly, wherein the first plurality of springs relieves intrinsic stress of the first diaphragm and the second plurality of springs relieves intrinsic stress of the second diaphragm, and sealing the first and second pluralities of slots with sealing material, thereby disabling the first and second pluralities of springs. In an embodiment the method further comprises forming a sealed, low-pressure region between the first and second diaphragms. In an embodiment the outer regions of the first and second diaphragms are disposed within the low-pressure region. In another embodiment the outer regions of the first and second diaphragms are disposed outside of the low-pressure region. In an embodiment the forming step comprises forming the assembly over a substrate, and the method further comprises before the releasing step, etching away a first portion of the substrate underlying the assembly such that the assembly has a first region overlying the first portion and not anchored to the substrate and a second region that is anchored to a second portion of the substrate, wherein the first plurality of springs and the second plurality of springs are disposed within the first region proximate to a boundary between the first and second regions. In an embodiment portions of the first and second diaphragms disposed within the first region are movable in response to pressure waves during operation of the MEMS microphone. In an embodiment the sealing material comprises a first material, the rigid central layer comprises a second material, and the first and second diaphragms comprise a third material.

Figure 10:
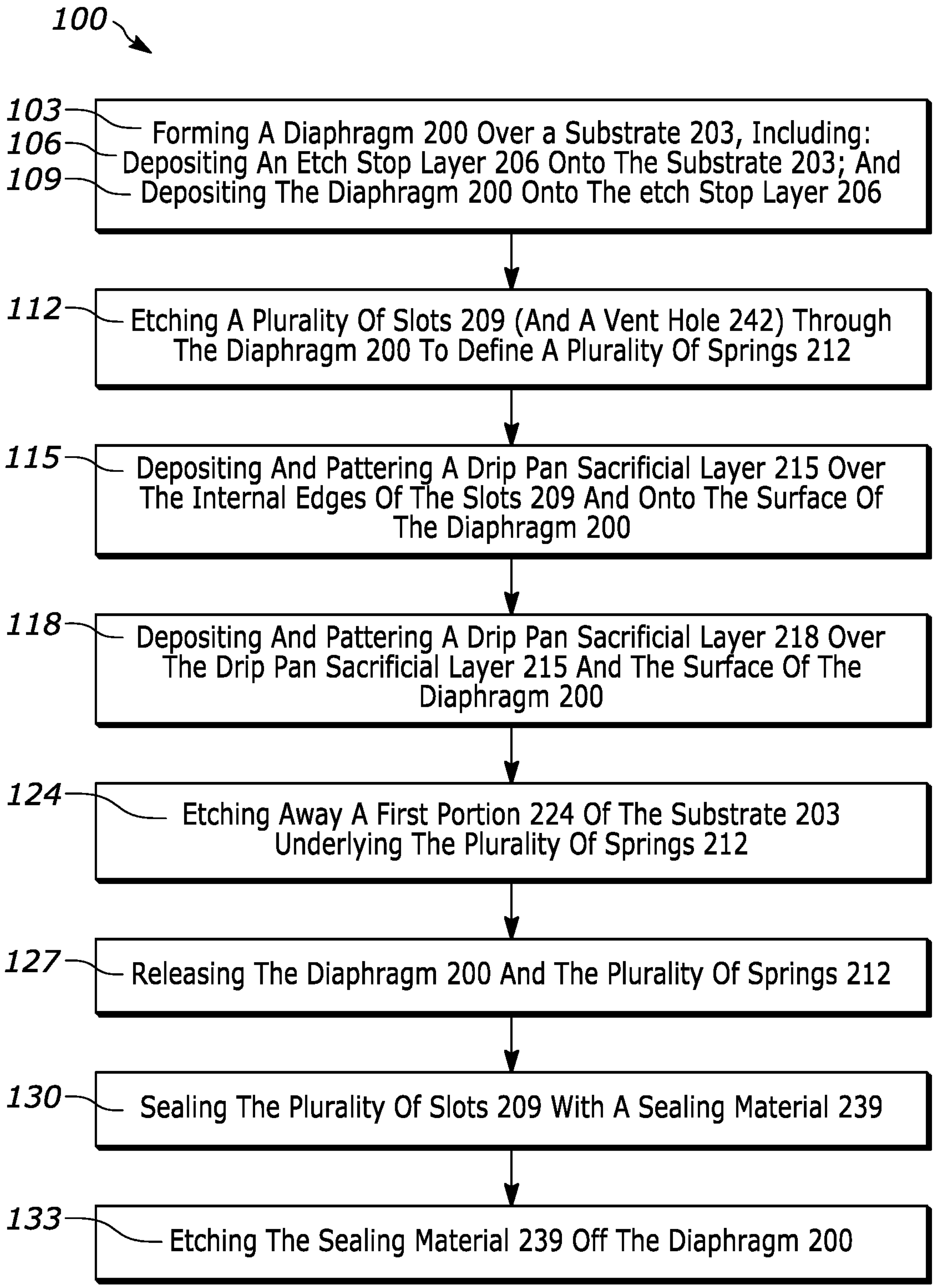
FIG. 10 illustrates the steps of a first exemplary embodiment for making a die for a MEMS diaphragm assembly.

In the following disclosure, steps of first, second, and third exemplary methods are generally denoted using 100 series reference numerals, while exemplary structures used or produced by the first, second, and third exemplary methods are generally denoted using 200 series reference numerals. A chart illustrating the steps in the first exemplary method 100 of fabricating a die for a microelectromechanical systems (MEMS) microphone is shown in FIG. 10. In an embodiment of the first exemplary method 100, at step 103 a diaphragm 200 is formed. FIG. 3 illustrates an exemplary top plan view of the diaphragm 200, and FIGS. 1 and 2 illustrate schematic cross-sectional views of FIG. 3 taken generally along the lines 2-2 in FIG. 3 at different steps in the method 100 as will be described, wherein the vertical dimension in the cross-sectional views is purposely exaggerated for clarity, and including the centerline 201 for reference.

Figure 2:
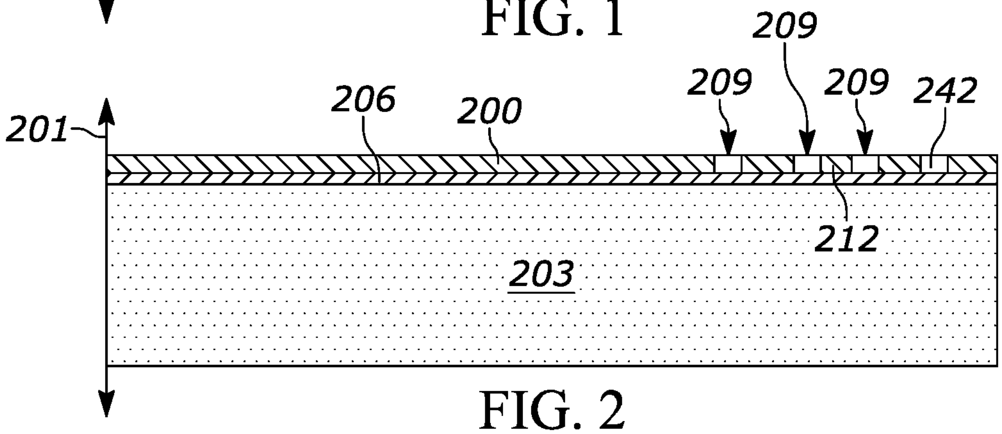
FIG. 2 illustrates a schematic cross-sectional view of the first embodiment of a die for a MEMS diaphragm assembly at another step in fabrication thereof, the view taken generally along the lines 2-2 of FIG. 3.
Figure 3:
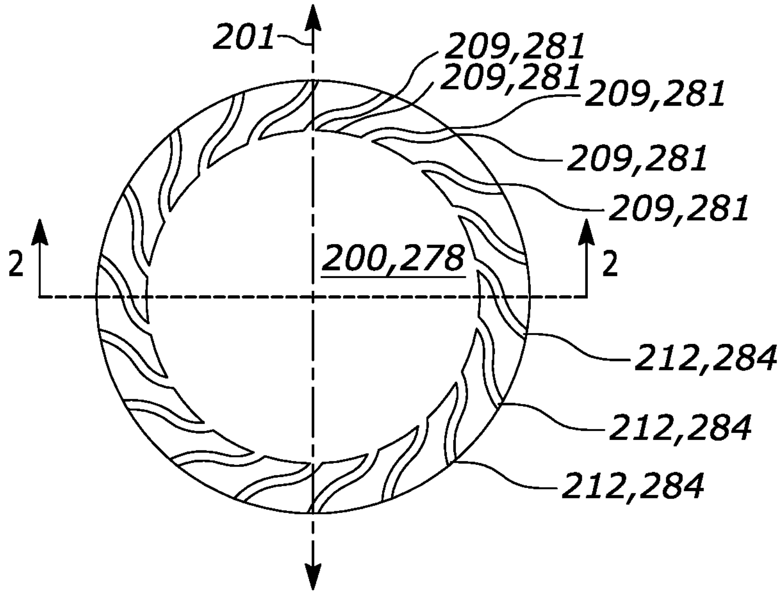
FIG. 3 illustrates a top plan view of the first embodiment of a die for a MEMS diaphragm assembly at a step in fabrication thereof.

Referring to FIGS. 1 and 2, in an embodiment, the forming step 103 comprises forming the diaphragm 200 over a substrate 203. For example without limitation, forming step 103 includes step 106 of depositing an etch stop layer 206 onto the substrate 203, and step 109 of depositing the diaphragm 200 onto the etch stop layer 206. Referring to FIGS. 2 and 3, in an embodiment, at step 112, a plurality of slots 209 is etched through the diaphragm 200 to define a plurality of springs 212. In an embodiment a vent hole 242 is etched through the diaphragm 200 simultaneously with the slots forming the springs in step 112. It should be noted that the slots 209 illustrated in FIG. 2 are drawn schematically for clarity and for consistency with FIG. 3.

Figure 4:
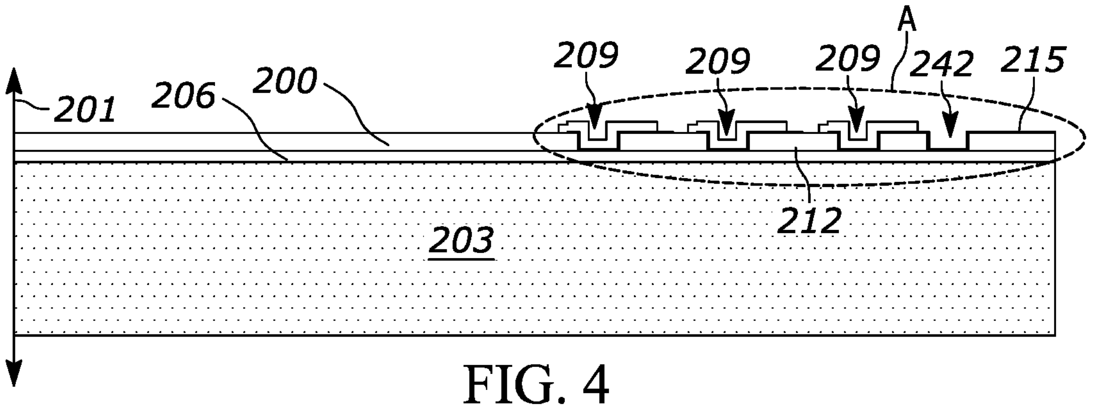
FIG. 4 illustrates a schematic cross-sectional view of the first embodiment of a die for a MEMS diaphragm assembly at a step in fabrication thereof, the view taken generally along the lines 4-4 of FIG. 6A.
Figure 6A:
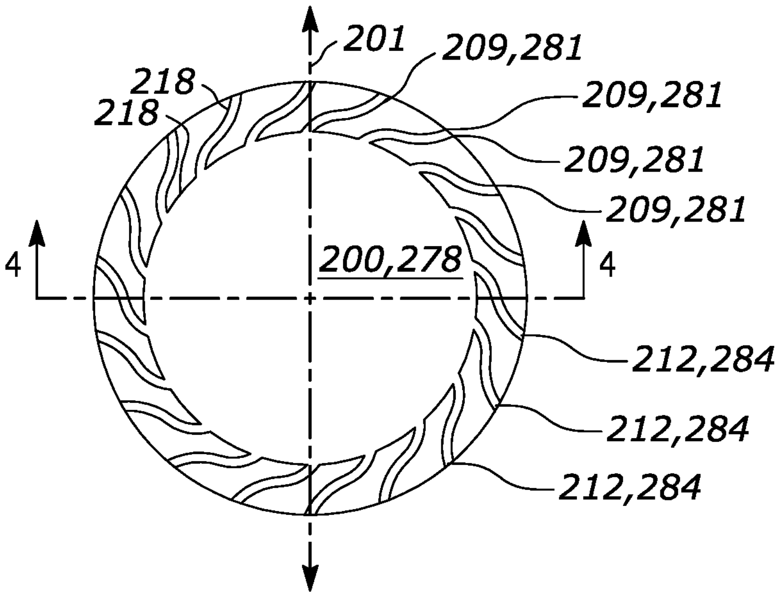
FIG. 6A illustrates a top plan view of the first embodiment of a die for a MEMS diaphragm assembly at another step in fabrication thereof.

FIG. 6A illustrates an exemplary top plan view of the diaphragm 200 at a later step in the method 100. FIG. 4 illustrates a schematic cross-sectional view of FIG. 6A taken generally along the lines 4-4 in FIG. 6A at different steps in the method 100 as will be described, wherein the vertical dimension in the cross-sectional views is purposely exaggerated for clarity, and including the centerline 201 for reference. Referring to FIG. 4, in an embodiment at step 115 a drip pan sacrificial layer 215 is deposited and patterned over the slots 209 and onto the surface of the diaphragm 200. A portion of drip pan sacrificial layer 215 is etched away over the surface of the diaphragm 200.

Figure 5:
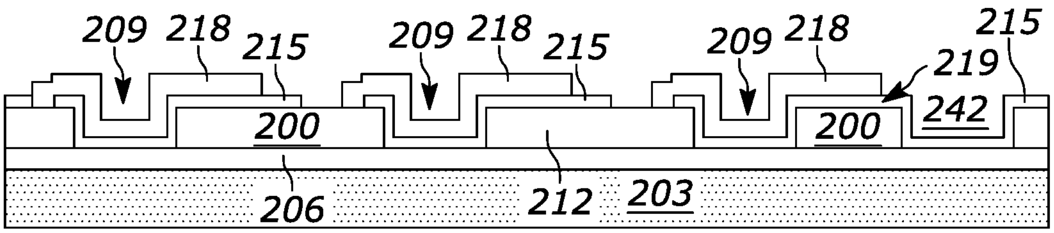
FIG. 5 illustrates a schematic cross-sectional view of the first embodiment of a die for a MEMS diaphragm assembly at another step in fabrication thereof, the view taken generally along the lines 4-4 of FIG. 6A.

Referring to FIG. 5, the portion of FIG. 4 shown within the dashed ellipse marked A is shown in an enlarged view. In an embodiment at step 118 a drip pan layer 218 is deposited and patterned over the drip pan sacrificial layer 215 and the surface of the diaphragm 200. Where the diaphragm 200 comprises a layer of a first material, the drip pan layer 218 deposited on one or more portions of the diaphragm 200 comprises a layer of a second material 218, wherein the layer of the second material 218 extends across each of the plurality of slots 209 while leaving a gap 219 (best visible in FIG. 7) between the layer of the second material 218 and the diaphragm 200 on at least one side of each of the plurality of slots 209. In FIG. 5 the gap 219 is still filled with the drip pan sacrificial layer 215, which is subsequently etched away.

Figure 6B:
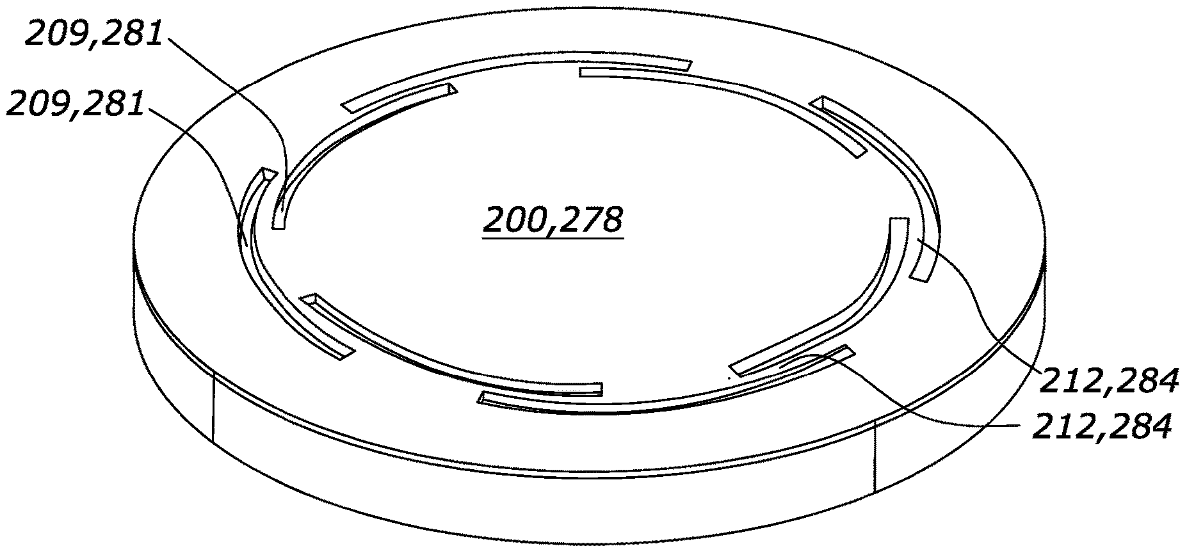
FIG. 6B illustrates a top perspective view of another embodiment of a die for a MEMS diaphragm assembly at a step in the fabrication thereof.

In an embodiment the first material of the diaphragm 200 and the second material 218 are the same material; however, in other embodiments the first and second materials 200, 218 are different materials. In an embodiment, suitable materials for the diaphragms 200, 278, the drip pans layers 218, 263, the rigid central layer 252, the back plate 251, and the one or more pins/posts 266 include, for example without limitation polysilicon, silicon nitride, and/or metals. In an embodiment, suitable materials for any of the sacrificial layers 206, 215, 221, 257, and 267 described herein include, for example without limitation silicon oxide and/or polymers. In an embodiment, suitable materials for the sealing material 239 includes, for example without limitation aluminum oxide, titanium oxide, silicon oxide, and silicon nitride. FIG. 6B illustrates another exemplary embodiment of a diaphragm 200, 278 for use in a die for a MEMS diaphragm assembly showing another possible geometry for the slots 209, 281 and the resulting springs 212, 284.

Figure 7:
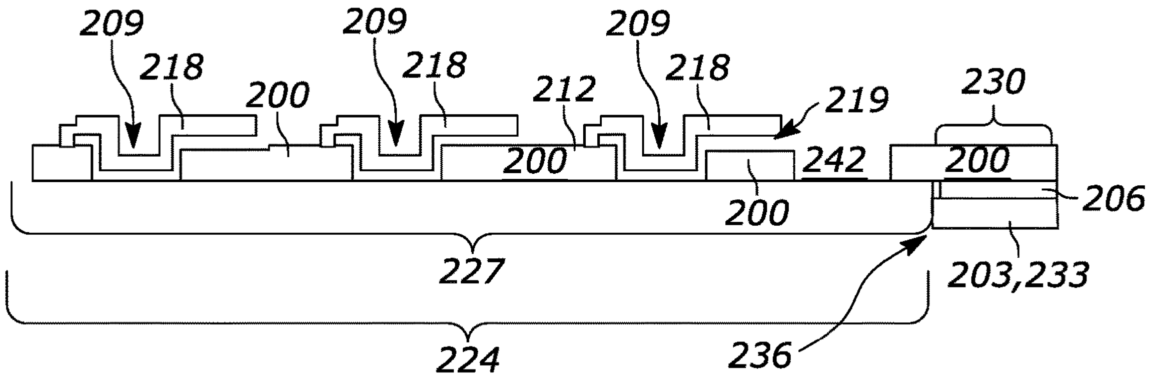
FIG. 7 illustrates a schematic cross-sectional view of the first embodiment of a die for a MEMS diaphragm assembly at a further step in fabrication thereof.

Referring to FIG. 7, in an embodiment at step 124 a first portion 224 of the substrate 203 underlying the plurality of springs 212 is etched away such that the diaphragm 200 has a first region 227 overlying the first portion 224 and not anchored to the substrate 203 and a second region 230 that is anchored to a second portion 233 of the substrate 203. The plurality of springs 212 is disposed within the first region 227 proximate to a boundary 236 disposed between the first 227 and second 233 regions.

Still referring to FIG. 7, in an embodiment at step 127 the diaphragm 200 and the plurality of springs 212 are released by eliminating the sacrificial materials 206 and 215 as shown. As visible in FIG. 7, when so released the plurality of springs 212 is free to flex, for example, radially or circumferentially (refer to FIGS. 3, 6A, and 6B) so that when so released the plurality of springs 212 relieves the majority of intrinsic stress of the diaphragm 200.

Figure 8:
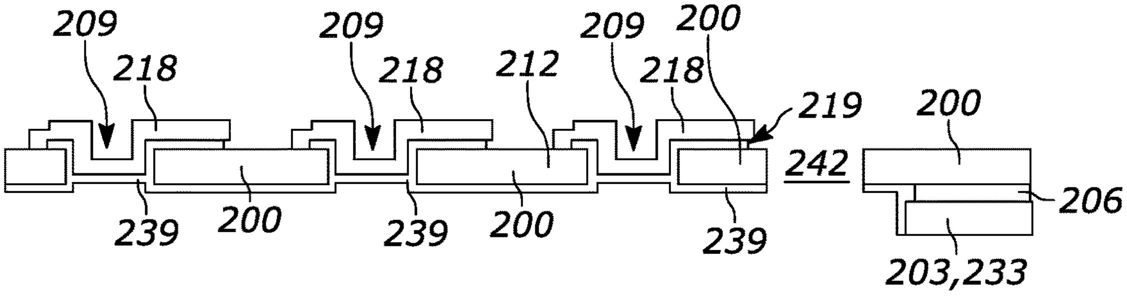
FIG. 8 illustrates a schematic cross-sectional view of the first embodiment of a die for a MEMS diaphragm assembly at yet another step in fabrication thereof.
Figure 9:
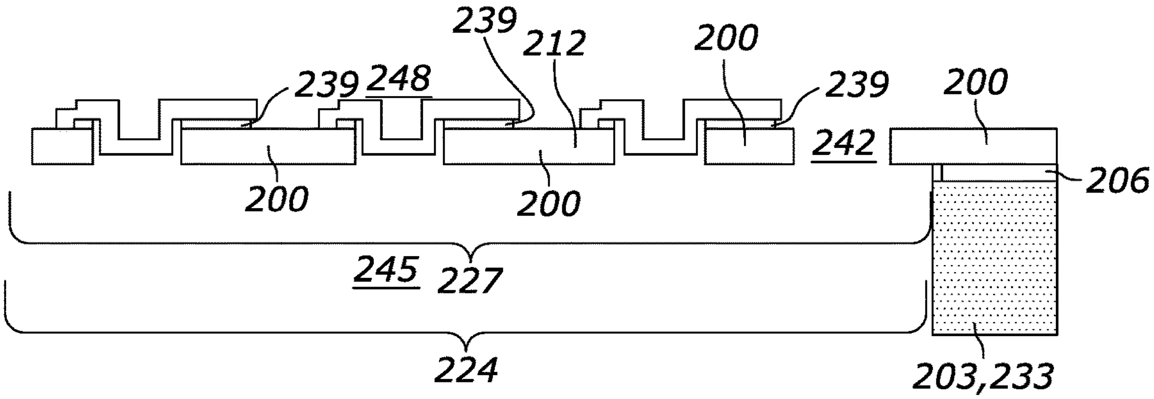
FIG. 9 illustrates a schematic cross-sectional view of the first embodiment of a die for a MEMS diaphragm assembly at yet a further step in fabrication thereof.

Referring to FIG. 8, in an embodiment at step 130 a sealing material 239 is deposited from below, wherein the sealing material 239 seals the plurality of slots 209, thereby disabling the springs 212. In an embodiment the sealing step 130 comprises sealing the gaps 219 with the sealing material 239, thereby disabling the plurality of springs 212. Referring to FIG. 9, in an embodiment at step 133, the sealing material 239 is etched off the lower surface of the diaphragm 200 while leaving the sealing material 239 within the gaps 219. In an embodiment the etching in step 133 is isotropic; however, in other embodiments the etching in step 133 is anisotropic, for example, operating along a line of sight from below. The steps of the first exemplary method 100 of fabricating a die for a microelectromechanical systems (MEMS) microphone are shown in FIG. 10.

In an embodiment the diaphragm 200 comprises a layer of a first material, the drip pan layer 218 comprises a layer of a second material 218, and the sealing material 239 comprises a third material 239. In an embodiment two or more of the first material 200, the second material 218, and the third material 239 are the same material; however, in other embodiments the first, second, and third materials 200, 218, 239 are all different materials.

In an embodiment, when the structure illustrated in FIG. 9 is used as part of a MEMS microphone, the first region 227 is movable in response to pressure waves during operation of the MEMS microphone. During operation of the MEMS microphone the vent hole 242 allows pressure between a front volume 245 and a back volume 248 of the MEMS microphone to equalize.

Figure 13:
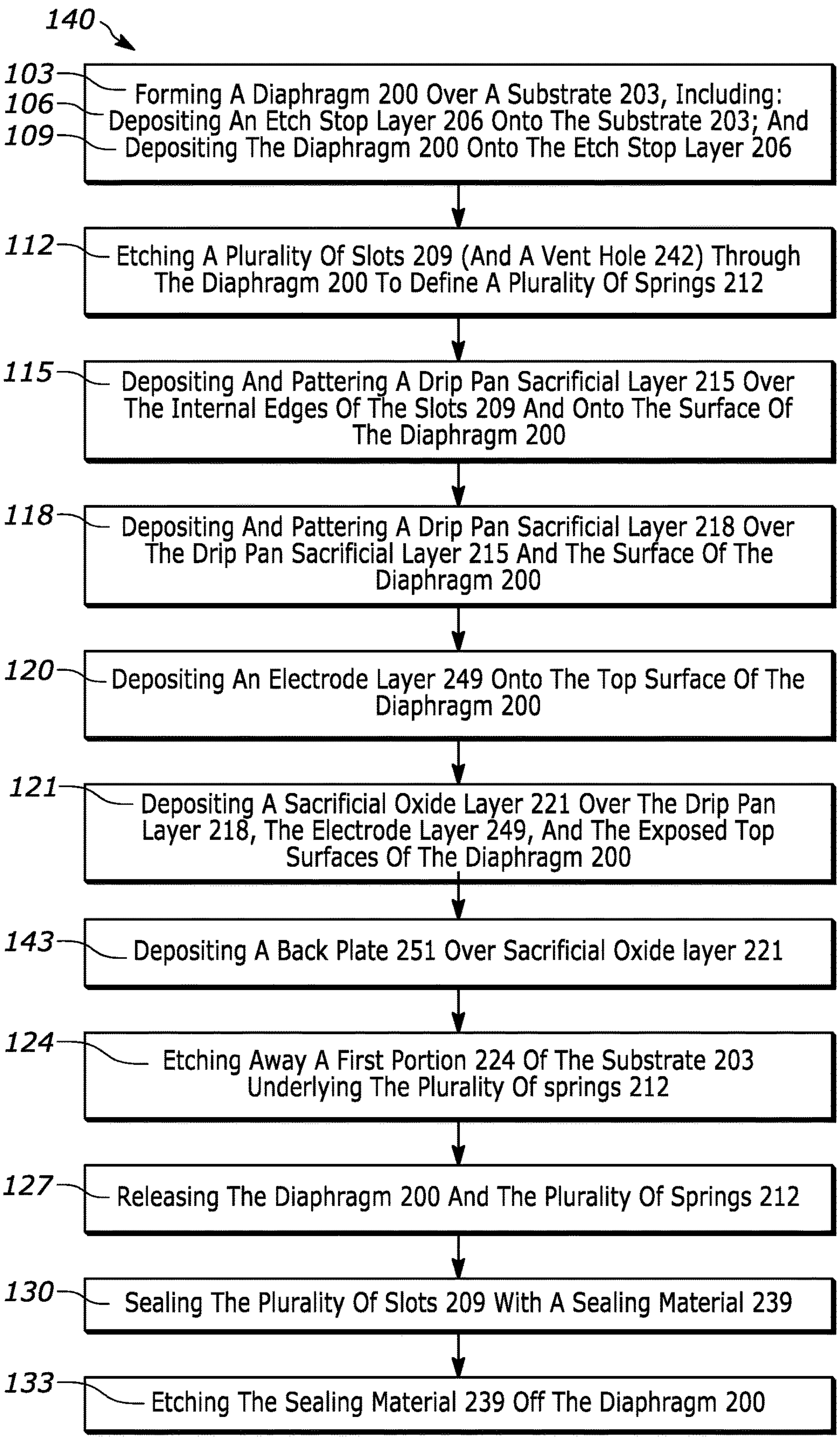
FIG. 13 illustrates the steps of a second exemplary embodiment for making a die for a MEMS diaphragm assembly.

As indicated in the chart in FIG. 13 illustrating the steps of a second exemplary method 140 of fabricating a die for a microelectromechanical systems (MEMS) microphone, the steps 103 through 118 are the same for the second exemplary method 140 as for the first exemplary method 100. However, the second exemplary method 140 includes additional steps not present in the first exemplary method 100.

Figure 11:
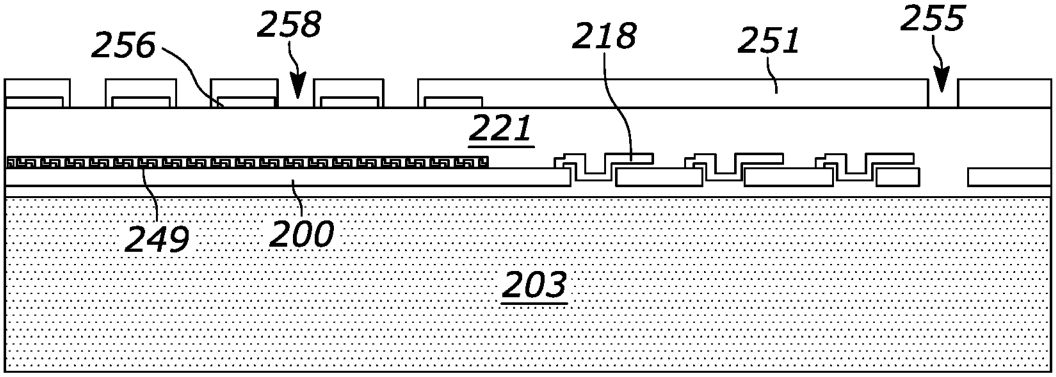
FIG. 11 illustrates a schematic cross-sectional view of an exemplary second embodiment of a die for a MEMS diaphragm assembly at a step in fabrication thereof.
Figure 12:
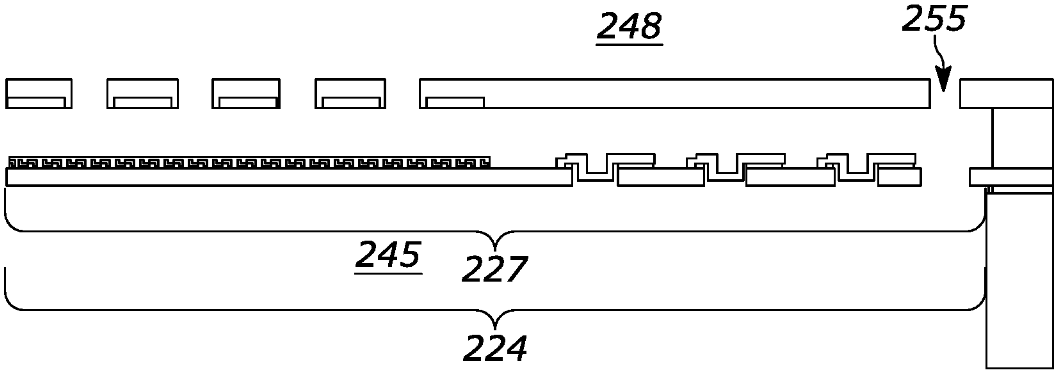
FIG. 12 illustrates a schematic cross-sectional view of an exemplary second embodiment of a die for a MEMS diaphragm assembly at another step in fabrication thereof.

Going back to the structure as illustrated in FIG. 4 as a starting basis, and next referring to FIG. 11 in an embodiment at step 120, an electrode layer 249 is disposed onto the top surface of the diaphragm 200. In an embodiment the material of electrode layer 249 is different than the material of the drip pan layer 218. In an embodiment the material of electrode layer 249 is the same as the material of drip pan layer 218 and can be formed simultaneously with the drip pan layer 218 in step 118. In an embodiment at step 121 a sacrificial oxide layer 221 is deposited over the drip pan layer 218, the electrode layer 249, and the exposed top surfaces of the diaphragm 200 as illustrated in FIG. 11. Still referring to FIG. 11, at step 143 a rigid element or layer 251, for example a back plate 251 is deposited over the sacrificial oxide layer 221. In an embodiment the back plate 251 as shown in FIG. 11 includes a pierce 255 and an electrode layer 256 including holes 258 disposed through the electrode layer 256. In an embodiment, FIG. 12 illustrates the resulting structure after the remaining steps 124, 127, 130, and 133 of the method 140, which are listed in FIG. 13 and are the same as for the method 100 as described hereinabove.

Figure 14A:
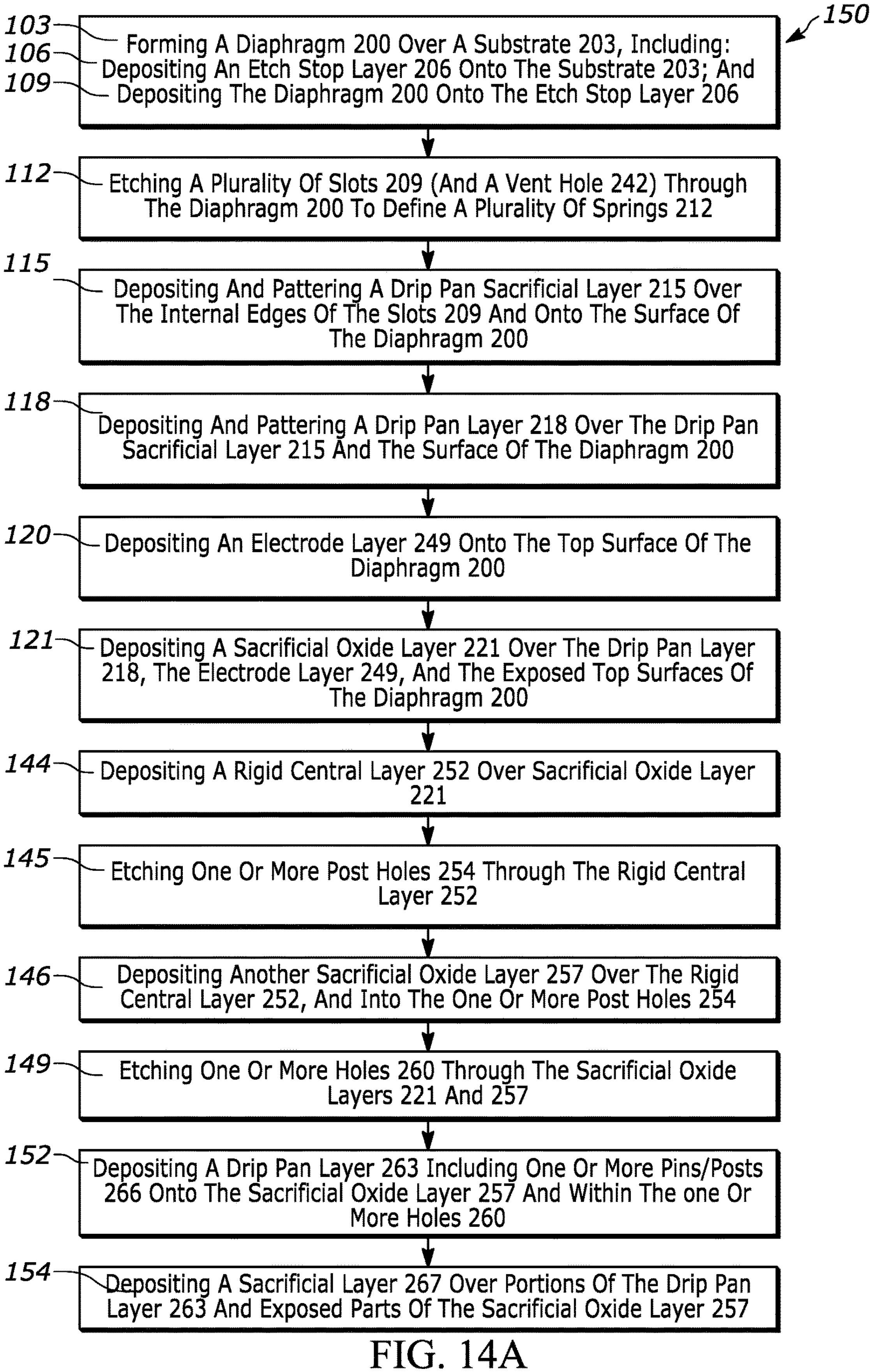
FIG. 14A illustrates some of the steps of a third exemplary embodiment for making a die for a MEMS diaphragm assembly.
Figure 14B:
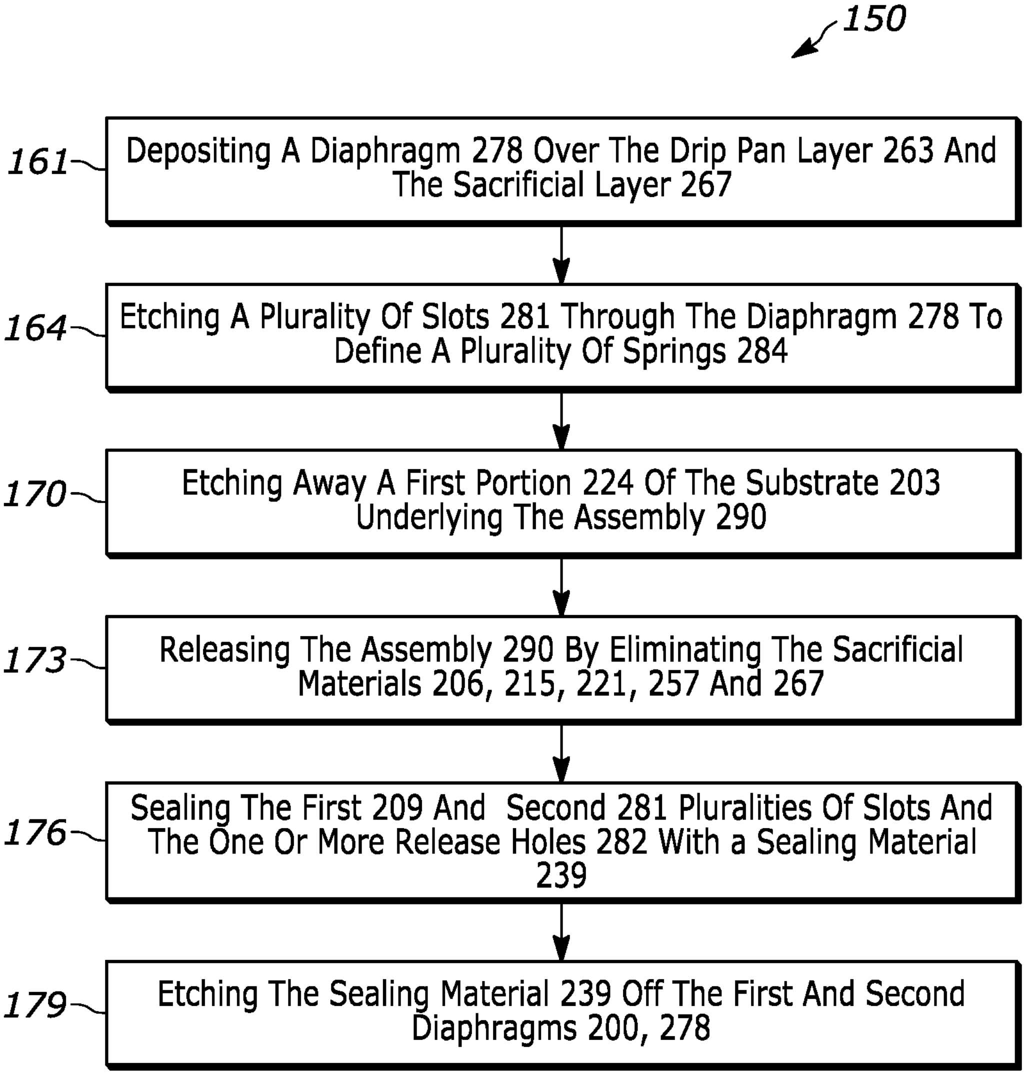
FIG. 14B illustrates the remaining steps of the third exemplary embodiment for making a die for a MEMS diaphragm assembly.

As indicated in the charts in FIG. 14A and FIG. 14B illustrating the steps of a third exemplary method 150 of fabricating a die for a microelectromechanical systems (MEMS) microphone, the steps 103 through 118 are the same for the third exemplary method 150 as for the second exemplary method 140. However, the third exemplary method 150 includes additional steps not present in the second exemplary method 140.

Figure 15A:
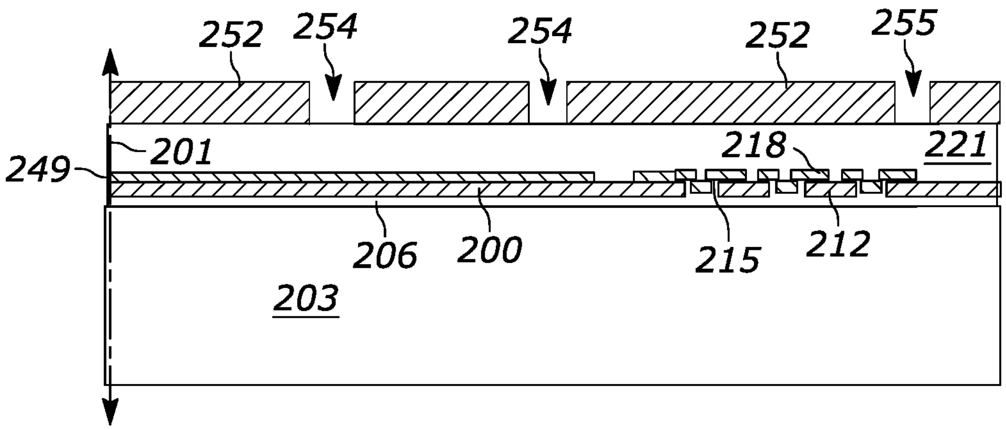
FIG. 15A illustrates a schematic cross-sectional view of a third embodiment of a die for a MEMS diaphragm assembly at another step in fabrication thereof.
Figure 15B:
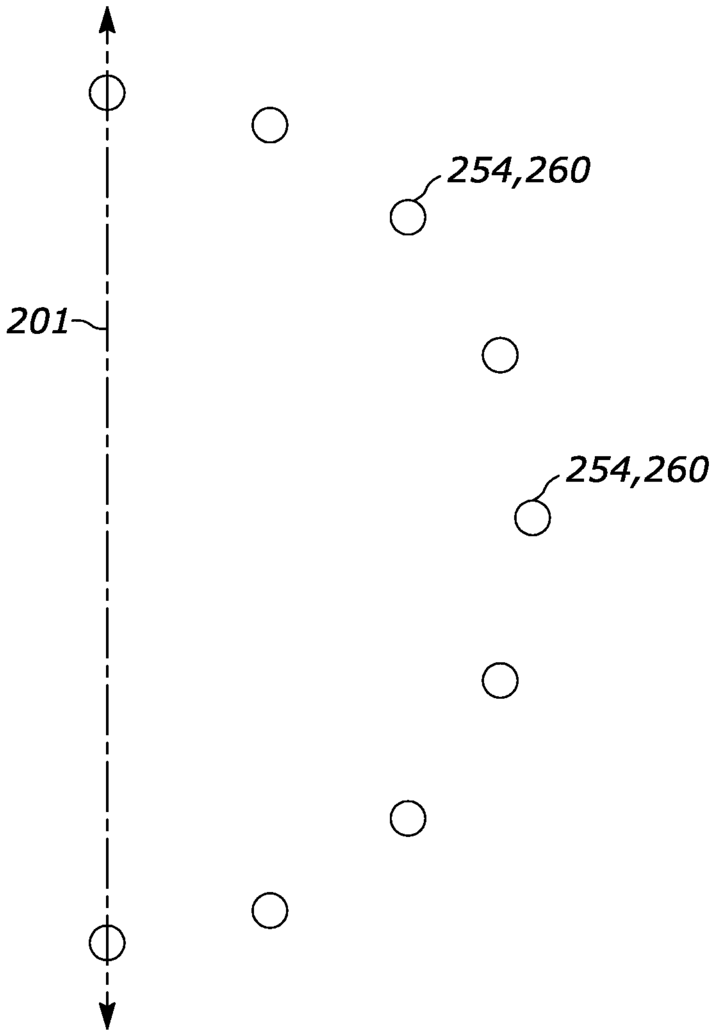
FIG. 15B illustrates a schematic top plan view of the third embodiment of a die for a MEMS diaphragm assembly at a further step in fabrication thereof.

Going back to the structure as illustrated in FIG. 4 as a starting basis, and now referring to FIG. 15A in an embodiment at step 120, an electrode layer 249 is disposed onto the top surface of the diaphragm 200. In an embodiment the material of electrode layer 249 is different than the material of the drip pan layer 218. In an embodiment the material of electrode layer 249 is the same as the material of drip pan layer 218 and can be formed simultaneously with the drip pan layer 218 in step 118. In an embodiment at step 121 a sacrificial oxide layer 221 is deposited over the drip pan layer 218, the electrode layer 249, and the exposed top surfaces of the diaphragm 200 as illustrated in FIG. 15A. Still referring to FIG. 15A, at step 144 a rigid layer 252, for example a rigid central layer 252 is deposited over the sacrificial oxide layer 221. In an embodiment the rigid central layer 252 includes one or more post holes 254 (an example of which is schematically shown in top plan view in FIG. 15B and seen as the right most gap 254 in the cross-sectional view of FIG. 15A). In an embodiment, at step 145, the one or more post holes 254 are etched through the rigid central layer 252.

Figure 16:
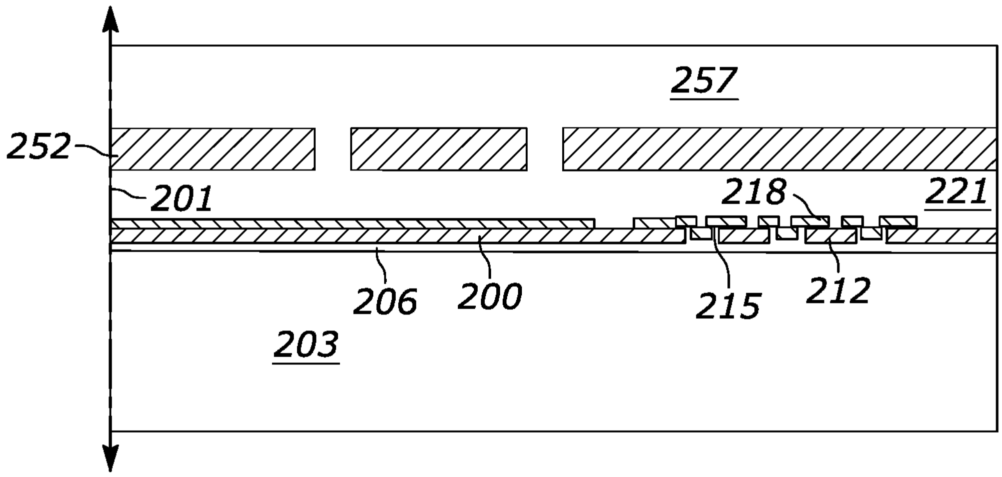
FIG. 16 illustrates a schematic cross-sectional view of the third embodiment of a die for a MEMS diaphragm assembly at still another step in fabrication thereof.
Figure 17:
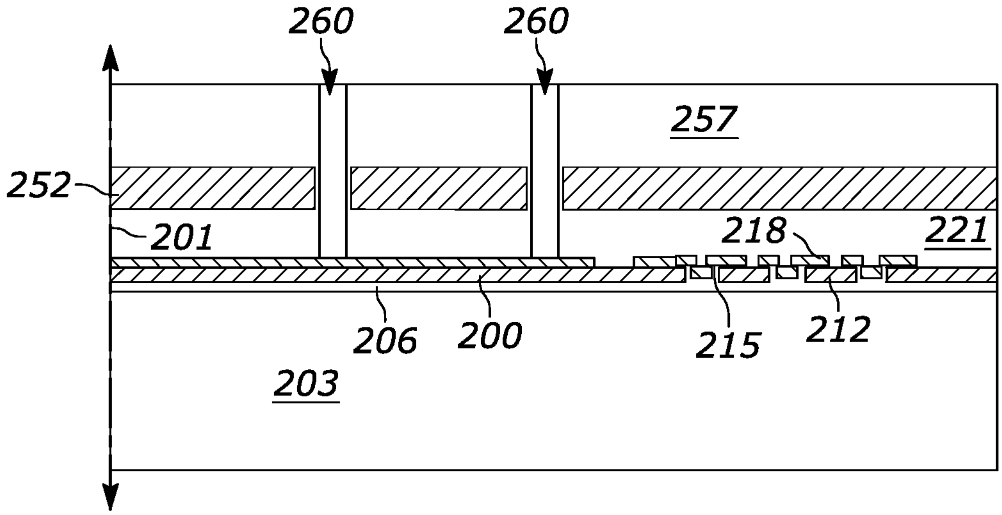
FIG. 17 illustrates a schematic cross-sectional view of the third embodiment of a die for a MEMS diaphragm assembly at a further step in fabrication thereof.

Referring to FIG. 16, in an embodiment at step 146 of the method 150 another sacrificial oxide layer 257 is deposited over the rigid central layer 252, and within the one or more post holes 254. Referring to FIG. 17, in an embodiment at step 149 of the method 150, one or more holes 260 are etched through the sacrificial oxide layers 221 and 257.

Figure 18:
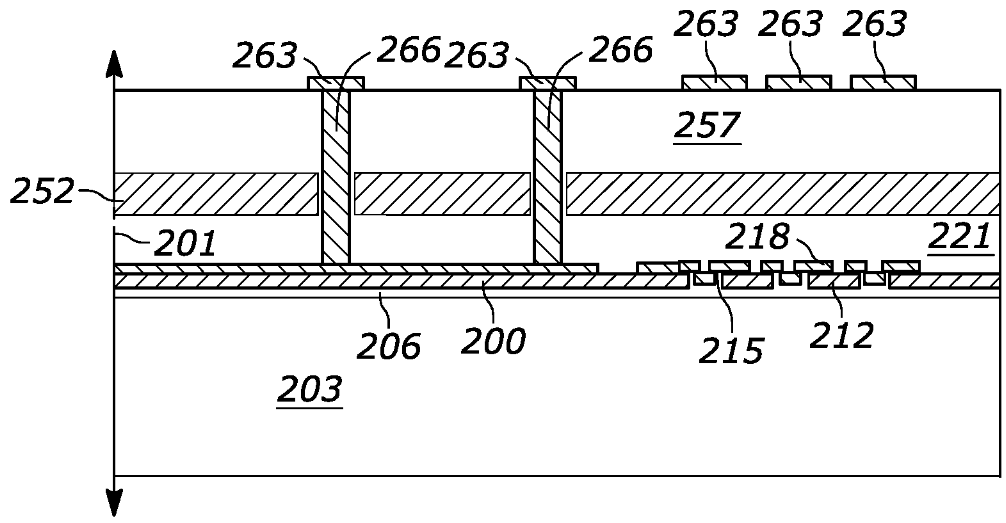
FIG. 18 illustrates a schematic cross-sectional view of the third embodiment of a die for a MEMS diaphragm assembly at yet a further step in fabrication thereof.
Figure 19:
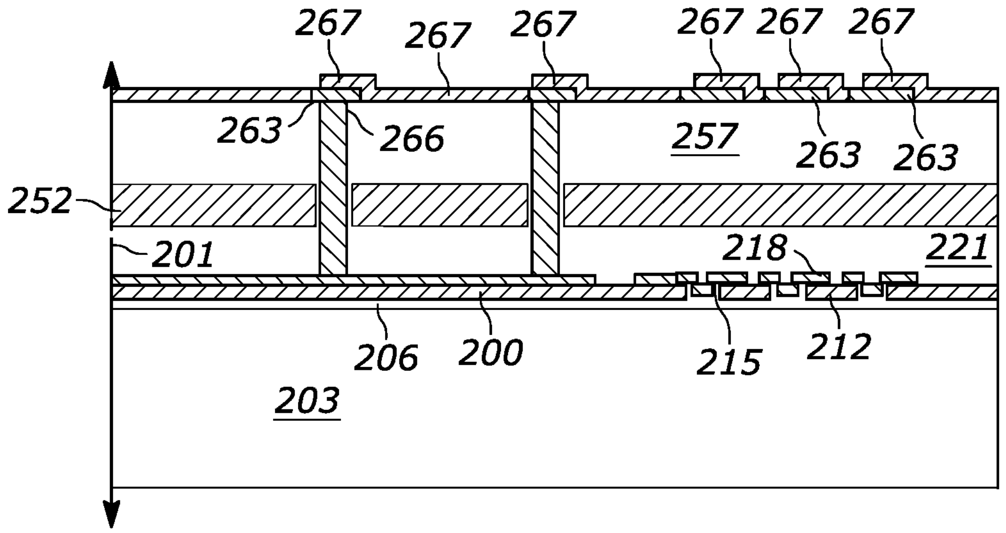
FIG. 19 illustrates a schematic cross-sectional view of the third embodiment of a die for a MEMS diaphragm assembly at yet another step in fabrication thereof.
Figure 20:
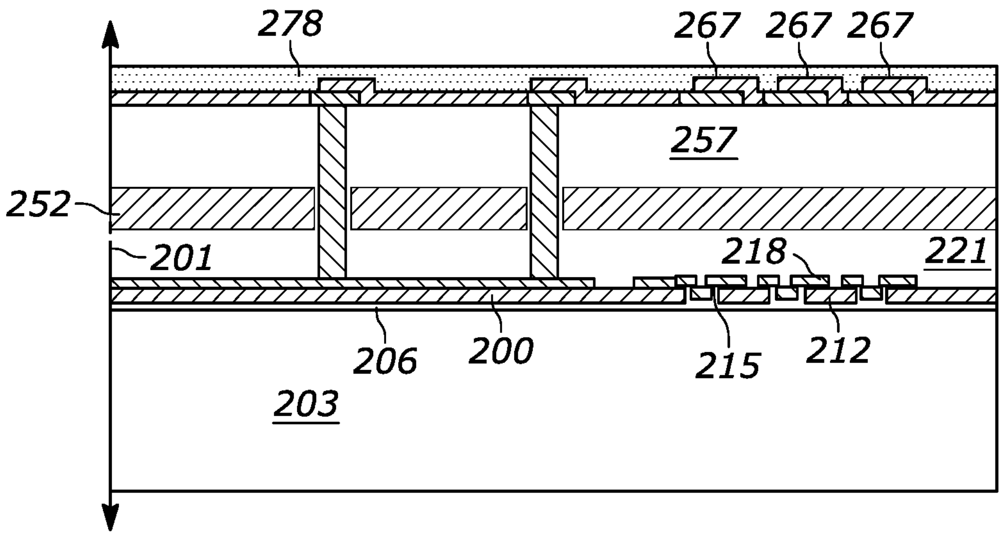
FIG. 20 illustrates a schematic cross-sectional view of the third embodiment of a die for a MEMS diaphragm assembly at still a further step in fabrication thereof.
Figure 21:
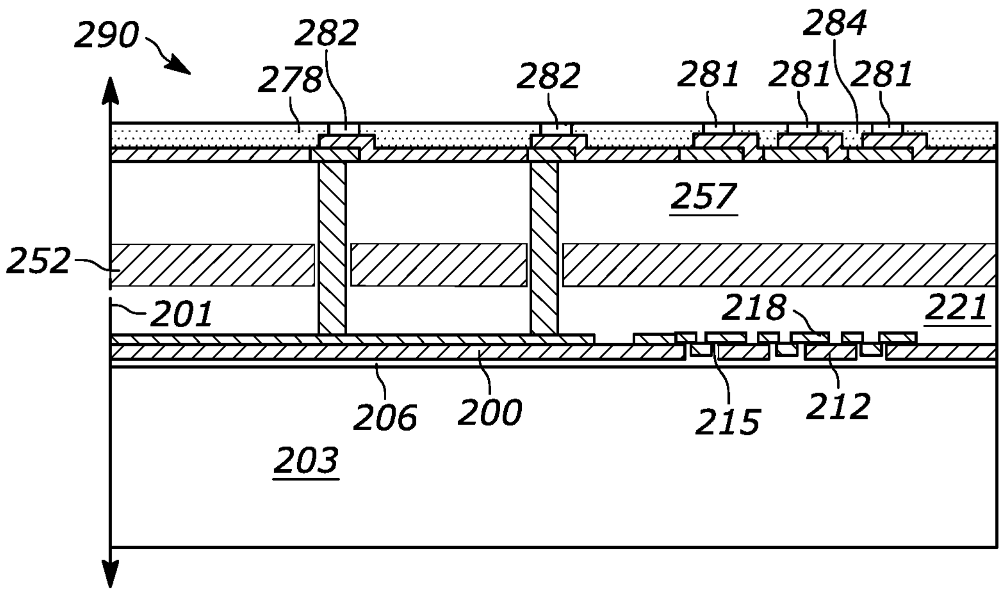
FIG. 21 illustrates a schematic cross-sectional view of the third embodiment of a die for a MEMS diaphragm assembly at yet a further step in fabrication thereof.

Referring to FIG. 18, in an embodiment at step 152 another drip pan layer 263 including one or more pins/posts 266 is deposited onto the sacrificial oxide layer 257 and within the one or more holes 260. Referring to FIG. 19, in an embodiment at step 154, a sacrificial layer 267 is deposited over portions of the drip pan layer 263 and exposed portions of the sacrificial oxide layer 257. Continuing the method 150 in FIG. 14B and referring to FIG. 20, in an embodiment at step 161 a diaphragm 278 is deposited over the drip pan layer 263 and the sacrificial layer 267. Referring to FIG. 21, in an embodiment, at step 164, a plurality of slots 281 is etched through the diaphragm 278 to define a plurality of springs 284 (also see FIG. 24). It should be noted that the slots 281 illustrated in FIG. 21 are drawn schematically for clarity and for consistency with an exemplary top view of a sprung membrane 200, 278, for example, as shown in FIGS. 3 and 6A. In an embodiment, concurrent with the etching of the slots 281, release holes 282 are etched over each of the one or more pins/posts 266.

Still referring to FIG. 21, an assembly 290 includes the first diaphragm 200, the second diaphragm 278 disposed parallel to and spaced apart from the first diaphragm 200, and the rigid central layer 252 disposed between the first 200 and second 278 diaphragms. In an embodiment the first diaphragm 200 comprises a first electrode and the second diaphragm 278 comprises a second electrode.

Figure 22:
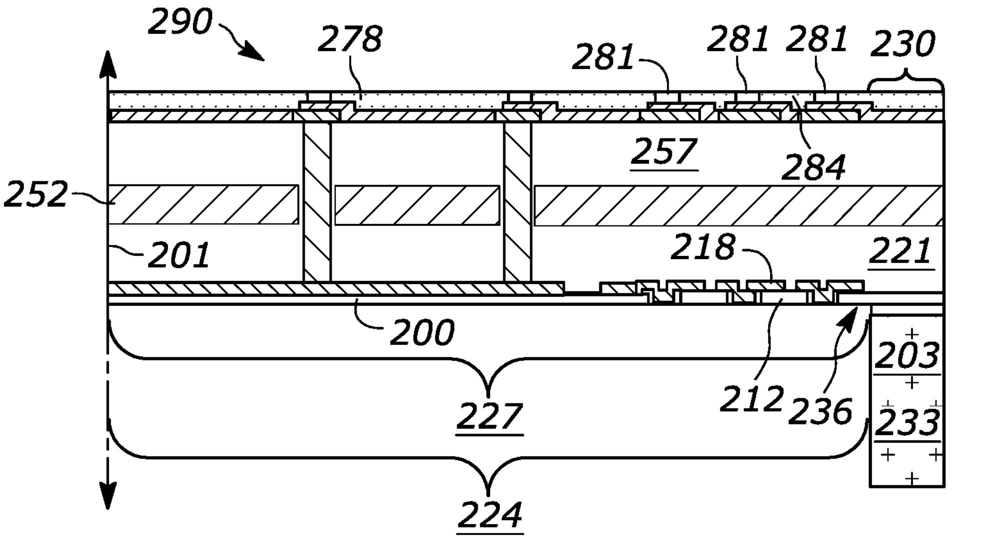
FIG. 22 illustrates a schematic cross-sectional view of the third embodiment of a die for a MEMS diaphragm assembly at another step in fabrication thereof.

Referring to FIG. 22, in an embodiment at step 170 a first portion 224 of the substrate 203 underlying the assembly 290 is etched away such that the assembly 290 has a first region 227 overlying the first portion 224 and not anchored to the substrate 203 and a second region 230 that is anchored to a second portion 233 of the substrate 203. The first plurality of springs 212 and the second plurality of springs 284 are disposed within the first region 227 proximate to a boundary 236 between the first 227 and second 230 regions.

Figure 23:
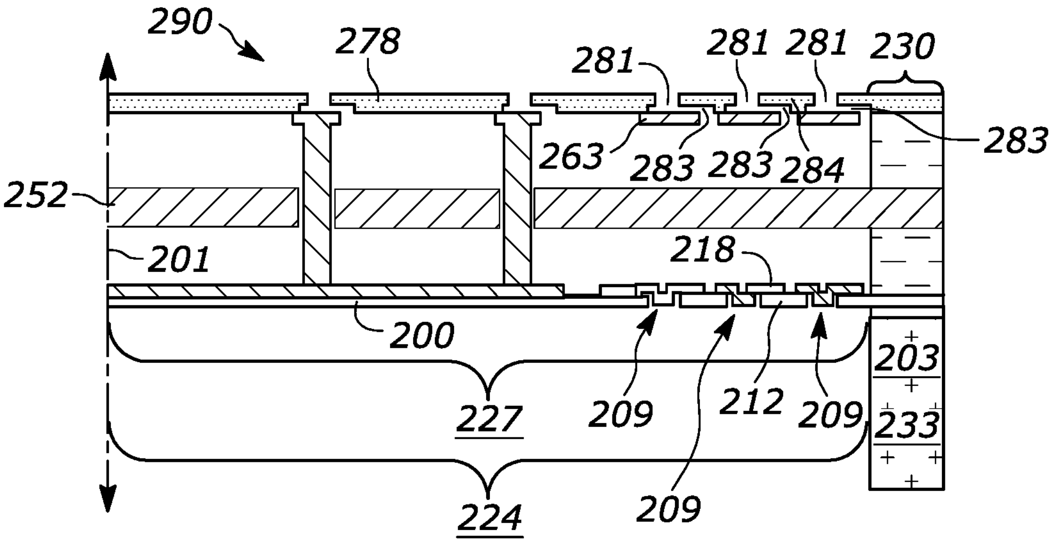
FIG. 23 illustrates a schematic cross-sectional view of the third embodiment of a die for a MEMS diaphragm assembly at yet another step in fabrication thereof.

Referring to FIG. 23, in an embodiment at step 173 the assembly 290 is released by eliminating the sacrificial materials 206, 215, 221, 257, and 267, as shown. When so released a gap 283 is formed between portions of the second diaphragm 278 and the drip pan layer 263 (see FIG. 23). Therefore, the first and second pluralities of springs 212 and 284 are free to flex, for example, radially or circumferentially (refer to FIGS. 3, 6A, and 6B) so that when so released the first plurality of springs 212 relieves a majority of the intrinsic stress of the first diaphragm 200, and the second plurality of springs 284 relieves a majority of the intrinsic stress of the second diaphragm 278. In an embodiment, the assembly 290 illustrated in FIG. 23 includes the first plurality of slots 209 disposed through the first diaphragm 200 to define a first plurality of springs 212, and a second plurality of slots 281 disposed through the second diaphragm 278 to define a second plurality of springs 284.

Figure 24:
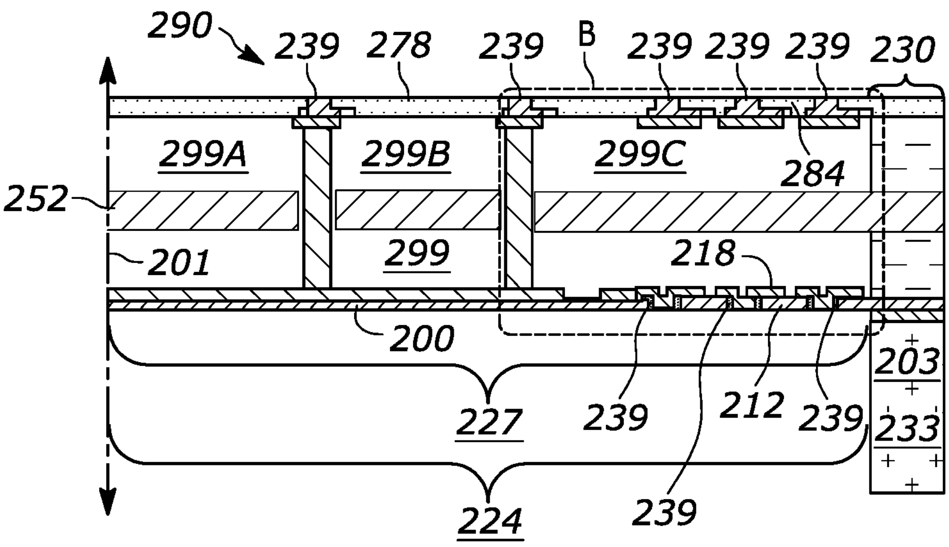
FIG. 24 illustrates a schematic cross-sectional view of the third embodiment of a die for a MEMS diaphragm assembly at another step in fabrication thereof.

At this point in the method 150, the assembly 290 is exposed to a lowered pressure, for example, within a vapor deposition chamber. Referring to FIG. 24, in an embodiment at step 176, the first plurality of slots 209, the second plurality of slots 281, the gaps 219 and 283, and the one or more release holes 282 are all sealed with the sealing material 239, thereby forming a low pressure region 299 in the spaces 299A, 299B, and 299C disposed between the first 200 and second 278 diaphragms, disabling the first plurality of springs 212, and disabling the second plurality of springs 284. In an embodiment, the low-pressure region 299 includes spaces 299A, 299B, and 299C, wherein space 299C extends radially outwardly to the first and second pluralities of slots 209, 281 (and the first and second pluralities of springs 212, 284). Therefore, in this embodiment the first and second pluralities of slots 209, 281 and the first and second pluralities of springs 212, 284 are disposed within the low-pressure region 299. However, in other embodiments low-pressure region 299 includes spaces 299A and 299B but not space 299C, so that the first and second pluralities of slots 209, 281 and the first and second pluralities of springs 212, 284 are disposed radially beyond (to the right in FIG. 24) and outside of the low-pressure region 299.

Figure 25:
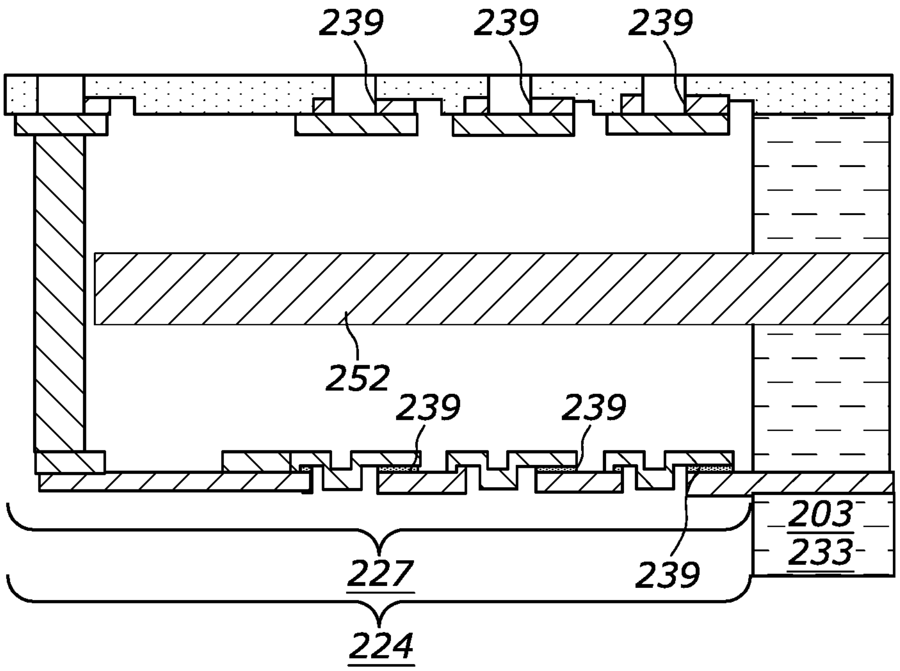
FIG. 25 illustrates a schematic cross-sectional view of the third embodiment of a die for a MEMS diaphragm assembly at yet another step in fabrication thereof.

Referring to FIG. 25, in an embodiment at step 179, the sealing material 239 is etched off the lower surface of the first diaphragm 200 and the upper surface of the second diaphragm 278. In an embodiment the etching in step 179 is isotropic; however, in other embodiments the etching in step 179 is anisotropic, for example, operating along a line of sight. The steps of the third exemplary method 150 of fabricating a die for a microelectromechanical systems (MEMS) microphone are shown in FIGS. 14A and 14B.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the disclosure be defined by the claims appended hereto and their equivalents.

What is claimed is:

1. A method of fabricating a die for a microelectromechanical systems (MEMS) microphone, the method comprising:

forming an assembly comprising a first diaphragm, a second diaphragm parallel to and spaced apart from the first diaphragm, and a rigid central layer disposed between the first and second diaphragms;

etching a first plurality of slots through an outer region of the first diaphragm to define a first plurality of springs;

etching a second plurality of slots through an outer region of the second diaphragm to define a second plurality of springs;

releasing the assembly, wherein the first plurality of springs relieves intrinsic stress of the first diaphragm and the second plurality of springs relieves intrinsic stress of the second diaphragm;

sealing the first and second pluralities of slots with sealing material, thereby disabling the first and second pluralities of springs; and forming a sealed, low-pressure region between the first and second diaphragms.

2. The method of claim 1, wherein the forming the sealed, low-pressure region comprises:

forming the sealed, low-pressure region such that the outer regions of the first and second diaphragms are disposed within the low-pressure region.

3. The method of claim 1, wherein the forming the sealed, low-pressure region comprises:

forming the sealed, low-pressure region such that the outer regions of the first and second diaphragms are disposed outside of the low-pressure region.

4. The method of claim 1, wherein the forming step comprises forming the assembly over a substrate; and further comprising before the releasing step, etching away a first portion of the substrate underlying the assembly such that the assembly has a first region overlying the first portion and not anchored to the substrate and a second region that is anchored to a second portion of the substrate;

wherein the first plurality of springs and the second plurality of springs are disposed within the first region proximate to a boundary between the first and second regions.

5. The method of claim 4, wherein the forming the assembly comprises:

forming the assembly over the substrate so that portions of the first and second diaphragms are movably disposed within the first region in response to pressure waves during operation of the MEMS microphone.

6. The method of claim 1, wherein the sealing the first and second pluralities of slots with the sealing material comprises:

sealing the slots with a first material different from a second and third material, the rigid central layer comprises the second material, and the first and second diaphragms comprise the third material.

* * * * *